United States Patent
Noguchi

(10) Patent No.: US 6,522,591 B2
(45) Date of Patent: Feb. 18, 2003

(54) SEMICONDUCTOR MEMORY CIRCUIT

(75) Inventor: Mineo Noguchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/888,620

(22) Filed: Jun. 26, 2001

(65) Prior Publication Data

US 2002/0017688 A1 Feb. 14, 2002

(30) Foreign Application Priority Data

Jun. 27, 2000 (JP) ........................................ 2000-192582

(51) Int. Cl.⁷ .................................................. G11C 7/00
(52) U.S. Cl. .................. 365/201; 365/200; 365/189.09; 365/189.07
(58) Field of Search ................................ 365/201, 200, 365/189.09, 189.07

(56) References Cited

U.S. PATENT DOCUMENTS 5,563,546 A * 10/1996 Tsukada ..................... 365/229
5,929,696 A * 7/1999 Lim et al. ................... 323/316
6,078,210 A * 6/2000 Uchida et al. .............. 327/530

FOREIGN PATENT DOCUMENTS

| JP | 5-80085 | 3/1993 |
| JP | 5-119127 | 5/1993 |
| JP | 6-119798 | 4/1994 |
| JP | 6-224648 | 8/1994 |
| JP | 8-51457 | 2/1996 |
| JP | 10-106299 | 4/1998 |
| JP | 10-116129 | 5/1998 |
| JP | 10-289577 | 10/1998 |

* cited by examiner

Primary Examiner—Huan Hoang
(74) Attorney, Agent, or Firm—Volentine Francos, PLLC

(57) ABSTRACT

A semiconductor memory device includes a reference voltage circuit which has an external power supply voltage input thereto and outputs a reference voltage. A standard voltage circuit has the reference voltage input thereto, and outputs a standard voltage. A voltage detecting circuit includes a PMOS transistor having a gate connected to the standard voltage, a source connected to a test mode signal pad, and a drain connected to the ground voltage via a resistor. A test mode control circuit outputs a test mode operation signal, an input terminal of the test mode control circuit being connected to a node of the voltage detecting circuit that is between the PMOS transistor and the resistor.

18 Claims, 11 Drawing Sheets

SEMICONDUCTOR MEMORY CIRCUIT

The present application claims priority under 35 U.S.C. §119 to Japanese Application No. 2000-192582 filed on Jun. 27, 2000, which is incorporated herein by reference in its entirely for all purposes.

BACKGROUND OF THE INVENTION

1. Field of the Invention

The present invention relates to a semiconductor memory device. In particular, the invention relates to a circuit, which detects a high voltage, and set a test mode of the semiconductor memory device.

2. Description of the Related Art

A semiconductor memory device has a test mode operation. When the test is performed, super high voltage is applied to a certain terminal. A voltage detecting circuit detects the super high voltage, and set the test mode of the semiconductor memory device.

FIG. 12 shows a conventional voltage detecting circuit. The voltage detecting circuit has a pad 1, NMOS transistors 2-1~2-n, a resistor 3 and an inverter 4. Super high voltage is applied to the pad 1. NMOS transistors and the resister are connected in series between the pad 1 and the ground voltage Vss. A node A between the transistor and the resistor 3 is connected to an input terminal of the inverter 4.

When a voltage higher than the n times of threshold voltage (n*Vth) is applied to the pad 1, the level of the node A is changed, and the inverter outputs L level., and the semiconductor memory device gets into a test mode.

However, the conventional voltage detecting circuit sometimes fails to set a test mode operation because of the manufacturing error of the threshold voltage.

SUMMARY OF THE INVENTION

A semiconductor memory device includes a reference voltage circuit being inputted external power supply voltage, and outputting a reference voltage, a standard voltage circuit being inputted the reference voltage, and outputting a standard voltage, a PMOS transistor having a gate, a source and a drain, the gate being connected to the standard voltage, a source being electrically connected to a pad, and a drain being connected to the ground voltage via a resistor and a test mode control circuit outputting a test mode operation signal, an input terminal of the test mode control circuit being connected to a node between the transistor and the resistor.

DETAILED DESCRIPTION OF THE PREFERRED EMBODIMENTS

The preferred embodiments are described below with reference to drawings.

Figure 1:
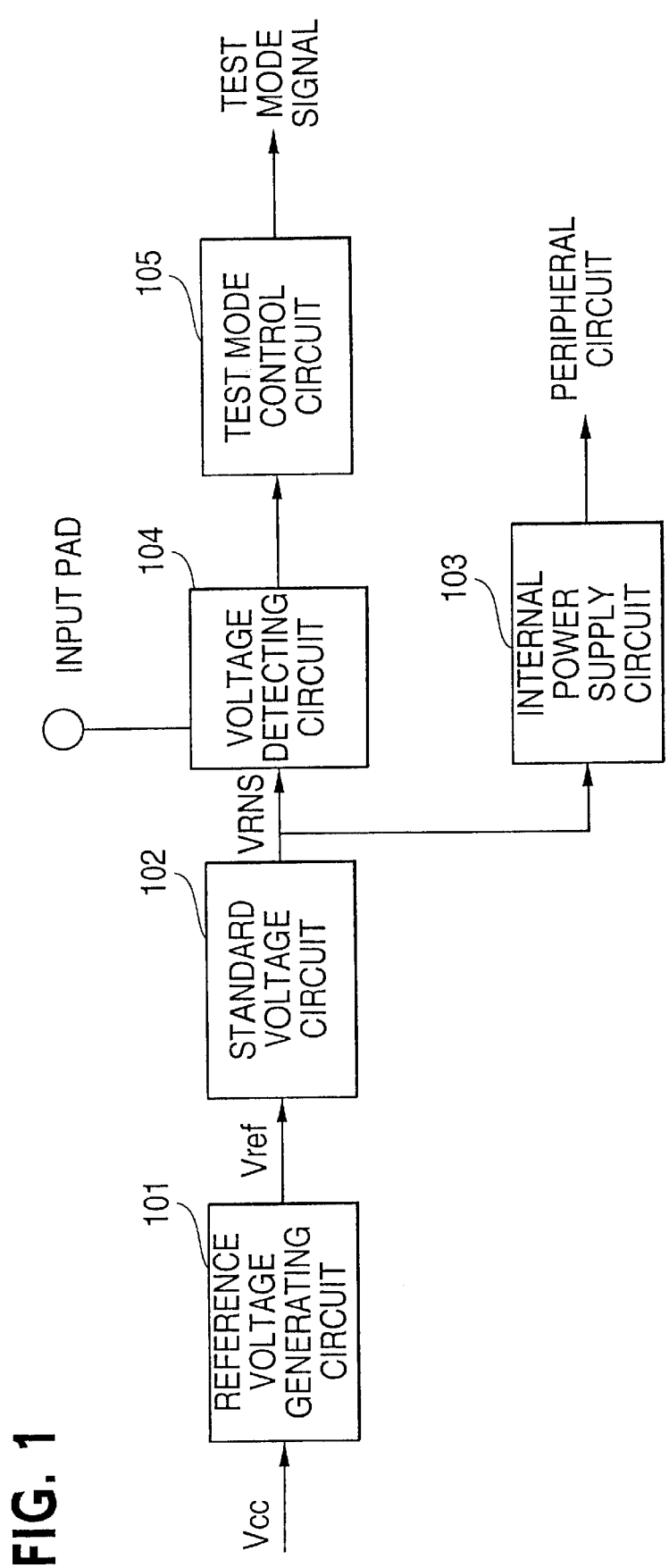
FIG. 1 illustrates a semiconductor memory device of a first embodiment.
Figure 2:
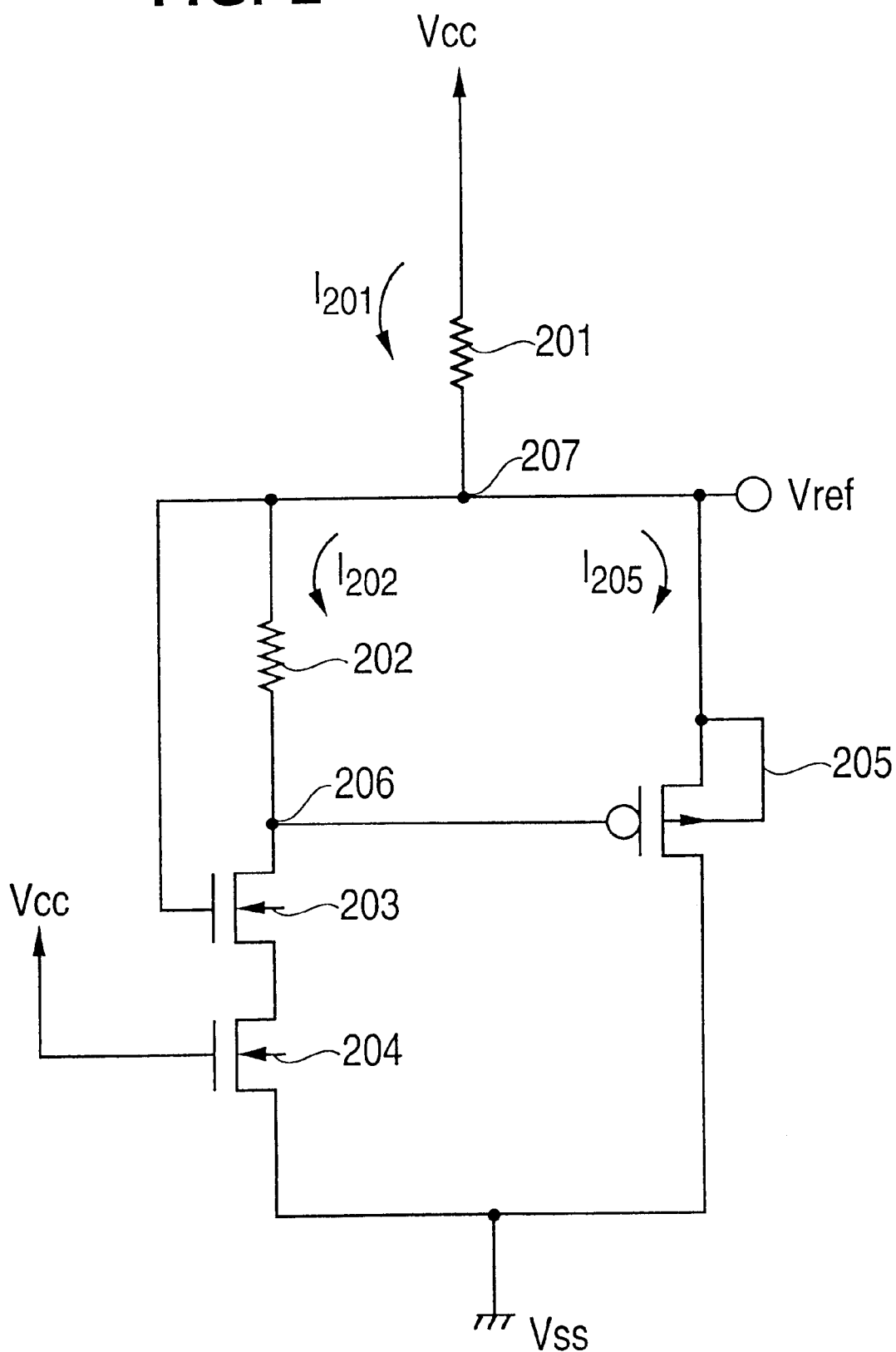
FIG. 2 illustrates a reference voltage generating circuit of FIG. 1.
Figure 3:
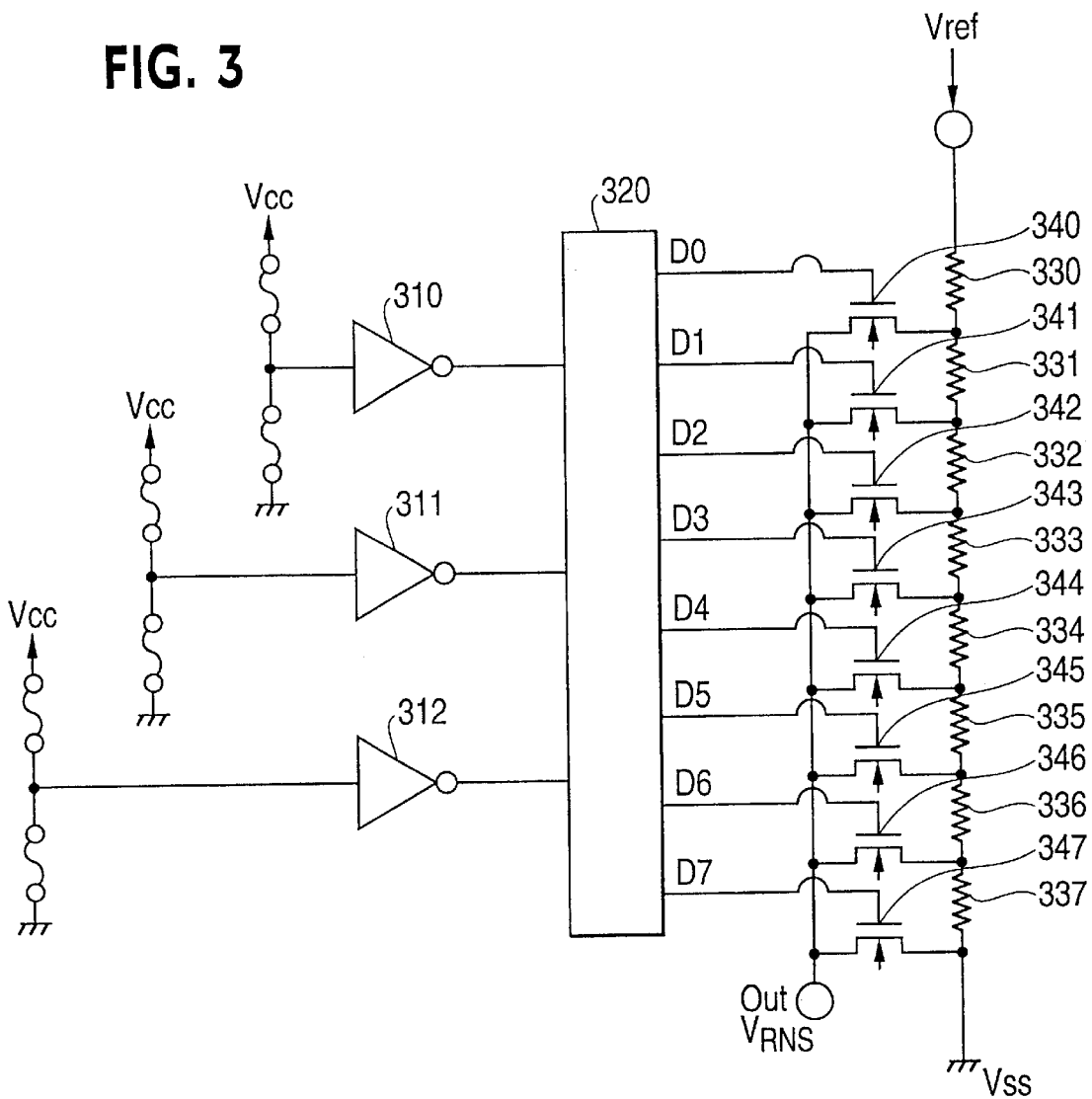
FIG. 3 illustrates a standard voltage circuit of FIG. 1.
Figure 4:
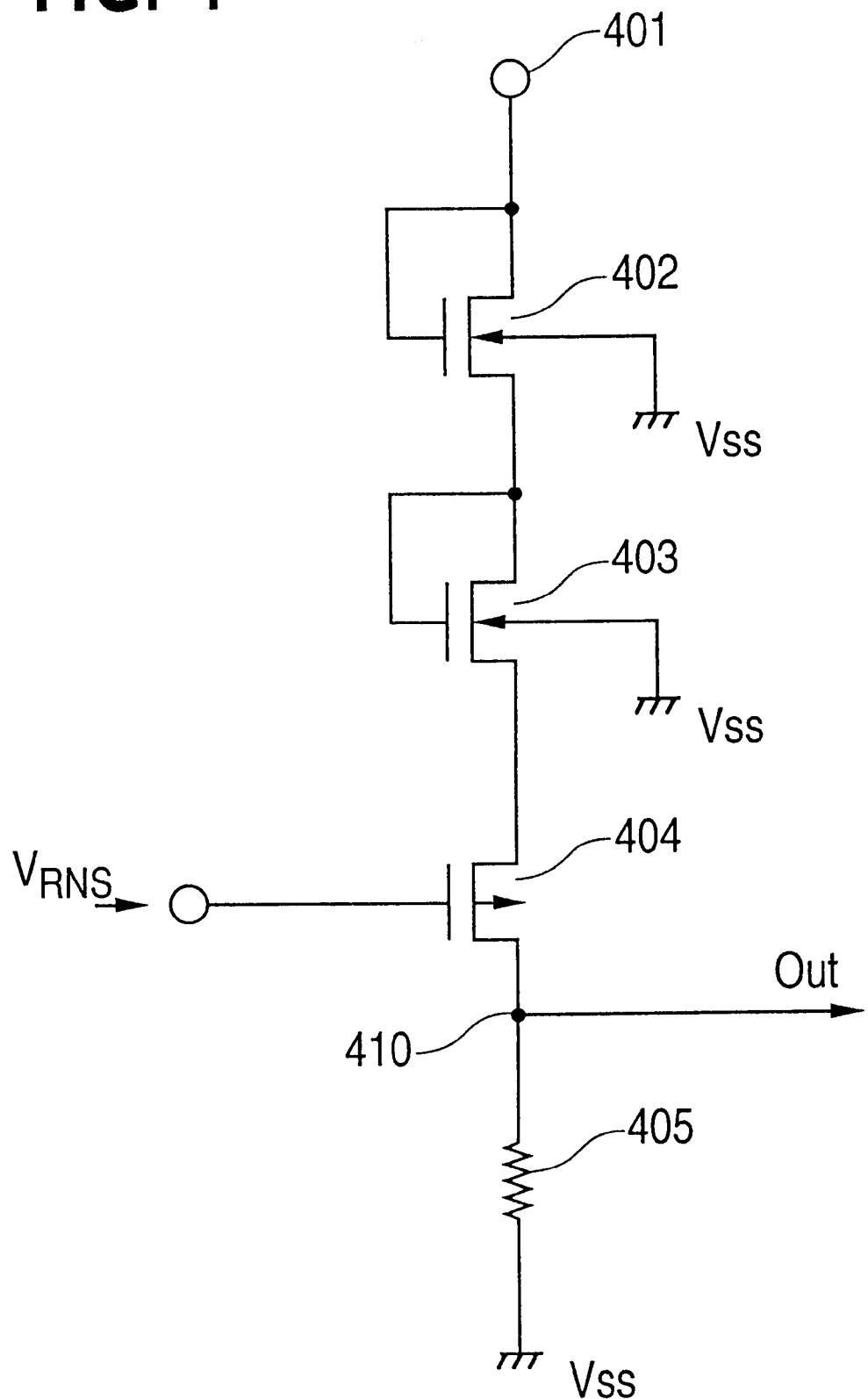
FIG. 4 illustrates a voltage detecting circuit of FIG. 1.

FIG. 1 is a block diagram of a semiconductor memory device of a first preferred embodiment. Only the peripheral portion of the voltage detecting circuit is shown in FIG. 1. FIGS. 2~4 show circuit diagrams of each block shown in FIG. 1.

The semiconductor memory device has a reference voltage generating circuit 101, a standard voltage circuit 102, an internal power supply circuit 103, a voltage detecting circuit 104 and a test mode control circuit 105.

An external power supply voltage Vcc (3.3V) is applied to the reference voltage generating circuit 101, and the reference voltage generating circuit 101 outputs a reference voltage Vref. The reference voltage Vref is not changed even if the external power supply voltage and a temperature of the circuit are changed. The reference voltage generating circuit 101 generates a reference voltage Vref, which is not influenced by external circumstance.

The reference voltage Vref is inputted to the standard voltage circuit 102. The standard voltage circuit 102 outputs an internal standard voltage VRNS. The standard voltage VRNS is not changed even if the external power supply voltage and the working temperature of the circuit are changed. The standard voltage is fixed value.

The voltage detecting circuit 104 detects the high voltage, which is applied to a test mode signal input pad. When the test mode signal is applied to the test mode signal input pad, a voltage level of a certain node of the voltage detecting circuit 104 is changed. If the voltage level applied to the test mode signal input pad is within the normal operation signal level, the voltage detecting circuit 104 outputs an L level signal. If the super high voltage is applied to the test mode signal input pad, the voltage level of the certain node is increased, and the voltage detecting circuit 104 outputs an H level signal.

The test mode control circuit 105 outputs a test mode signal when the voltage detecting circuit outputs H level signal.

The internal power supply circuit outputs internal power supply voltage according to the standard voltage VRNS and the external power supply voltage. The internal power supply circuit 103 is conventionally operation amplifier, which amplifies the standard voltage VRNS. However, when the external power supply voltage is increased (for example burn-in test mode), the internal power supply voltage is also increased. The internal power supply voltage is used as a power source to operate the peripheral circuit (for example decoder).

FIG. 2 shows the reference voltage generating circuit 101. The reference voltage generating circuit 101 has resistors 201, 202, NMOS transistors 203, 204 and a PMOS transistor 205.

The resistor 201 is connected to the external power supply Vcc. The resistor 202, NMOS 203 and 204 are connected in series between the resistor 201 and the ground voltage Vss.

PMOS 205 is connected in parallel with resistor 202, NMOS 203 and 204. PMOS 205 is connected between the resistor 201 and the ground voltage Vss.

A gate electrode of the NMOS 203 is connected to an output node of the circuit. The output node is the node 207 between the resistor 201 and 202. A gate electrode of the NMOS 204 is connected to the external power supply Vcc. A gate electrode of the PMOS 205 is connected to the node 206 between the resistor 202 and the NMOS 203. A substrate, on which the PMOS 205 is formed, is connected to the source of the PMOS 205 (node 207). The reference voltage Vref is outputted from the node 207.

There are two currents in the reference voltage circuit 101. One current passes the resistor 202, NMOS 203 and 204. The other current passes the PMOS 205. The current, which passes the resistor 202, is called I202, and the current, which passes the PMOS 205, is called I205 hereinafter. The current, which passes through the resistor 201, equals to the sum of the I202 and I205 (I201=I202+I205). The reference voltage Vref is expressed by following equation.

$$Vref=Vcc-(I201*R201)$$

R201: resistance value of the resistor 201

NMOS 204 is always on state because the gate electrode is connected to the external power supply Vcc. NMOS 203 is always on state because the gate electrode is connected to the Vref. When the external power supply voltage Vcc is increased, the gate voltage of the NMOS 204 is increased and the channel resistance of the NMOS 204 is decreased. Therefore, the current I202 is increased. A gate-to-source voltage Vtp of the PMOS 205 is expressed by the equation Vtp=I202*R202. Therefore, when the I202 is increased, the gate-to-source voltage Vtp of the PMOS 205 is increased, and I205 is also increased.

As described above, when the external power supply voltage is increased, the current, which passes through the resistor 201 is increased. A voltage drop of the resistor 201 is increased, and the reference voltage Vref is kept even. When the external power supply Vcc is decreased, the opposite operation is performed. I202 and I205 are decreased, and the voltage drop of the resistor 201 is decreased. Therefore, the reference voltage is kept even.

As described above, the reference voltage circuit of the preferred embodiment outputs a steady reference voltage even if the external power supply voltage varies.

A temperature compensation operation is described below. The threshold voltage of the PMOS 205 has a negative temperature coefficient. When the temperature is raised up, the threshold voltage of the PMOS is decreased. On the other hand, the channel resistance of the NMOS transistor has a positive temperature coefficient. Therefore, when the temperature is increased, the channel resistance is also increased. The reference voltage is expressed by following equation $$Vref=V206+Vtp$$

V206: voltage of node 206

If the operation temperature of the reference voltage circuit is raised up, the channel resistance of the NMOS 203 and 204 is increased, and the voltage of the node 206 is increased. On the other hand, gate-to-source voltage Vtp of the PMOS 205 is decreased. This decrease offsets the increase of the node 206. Therefore, the reference voltage Vref is not varied. If the operation temperature of the reference voltage circuit drops, the opposite operation is performed.

As described above, the reference voltage circuit outputs a steady voltage Vref even if the external power supply voltage varies, or the temperature varies.

FIG. 3 shows a standard voltage circuit of this embodiment. The outputted voltage Vref of the reference voltage circuit is sometimes different from the expected value. Therefore, the standard voltage circuit generates an internal standard voltage from the reference voltage.

The standard voltage circuit has fuse ROMs 310~312, a decoder circuit 320, resistor devices 330~337 and NMOS transistors 340~347 as switches. Resistor devices 330~337 are connected in series between the reference voltage Vref and the ground voltage Vss. Drains of the NMOS transistors 340~347 are connected to the one side of the resistors respectively. Sources of the NMOS transistors are connected to the output terminal of the standard voltage circuit. Gate electrodes of the NMOS transistors are connected to the decoder circuit 320 respectively.

Fuse ROMs 310~312 output H level or L level signal according to the fuses. There are three fuse ROMs in this embodiment. These fuse ROMs output three bit of signals according to the fuses. The decoder 320 has NAND gates and inverters, the decoder decodes three bit of signals and sets optionally D0~D7 H level.

If an adjustment is not performed, the output terminal D4 of the decoder circuit is H level. The output voltage VRNS of the standard voltage circuit is Vref/2 in this situation. If the VRNS is expected value, the adjustment described below is not performed. However, the output voltage of the reference voltage circuit is sometimes different from the expected value because of the manufacturing error. Therefore, the measurement of the standard voltage VRNS is performed, and the adjustment is performed.

The adjustment is performed by blowing the fuse of fuse ROMs. Fuse ROMs 310~312 output binary 000~111 according to fuses. The output terminals D0~D7 of the decoder circuit optionally become H level according to the signal of the fuse ROMs. Therefore, the output voltage VRNS of the standard voltage circuit is adjusted to the expected value.

As described above, the standard voltage circuit adjusts the reference voltage Vref to the standard voltage VRNS.

FIG. 4 shows the voltage detecting circuit 104 of the present embodiment. The voltage detecting circuit has a test mode signal input pad 401, NMOS transistors 402, 403, PMOS transistor 404 and a resistor 405.

A drain and a gate electrode of the NMOS 402 are connected to the test mode signal input pad 401, and the substrate of the NMOS 402 is connected to the ground voltage Vss. A drain and a gate electrode of the NMOS 403 is connected to the source of the NMOS 402, and the substrate of the NMOS 403 is connected to the ground voltage Vss. A source and a substrate of the PMOS 404 are connected to the source of the NMOS 403, and the drain of the PMOS 404 is connected to a node 410. A gate of the PMOS 404 is connected to the standard voltage VRNS.

The resistor 405 is connected between the node 410 and the ground voltage Vss. NMOS 402, 403, PMOS 404 and the resistor 405 are connected in series between the test mode signal input pad 401 and the ground voltage Vss. The node 410 is an output terminal of the voltage detecting circuit, therefore the voltage of node 410 determines whether the semiconductor memory device is in a test mode or not.

TTL (transistor transistor logic) level signal is inputted to the test mode signal input pad 401 during the normal operation. The node 410 keeps L level when the TTL level signal is inputted to the test mode signal input pad 401.

Figure 5:
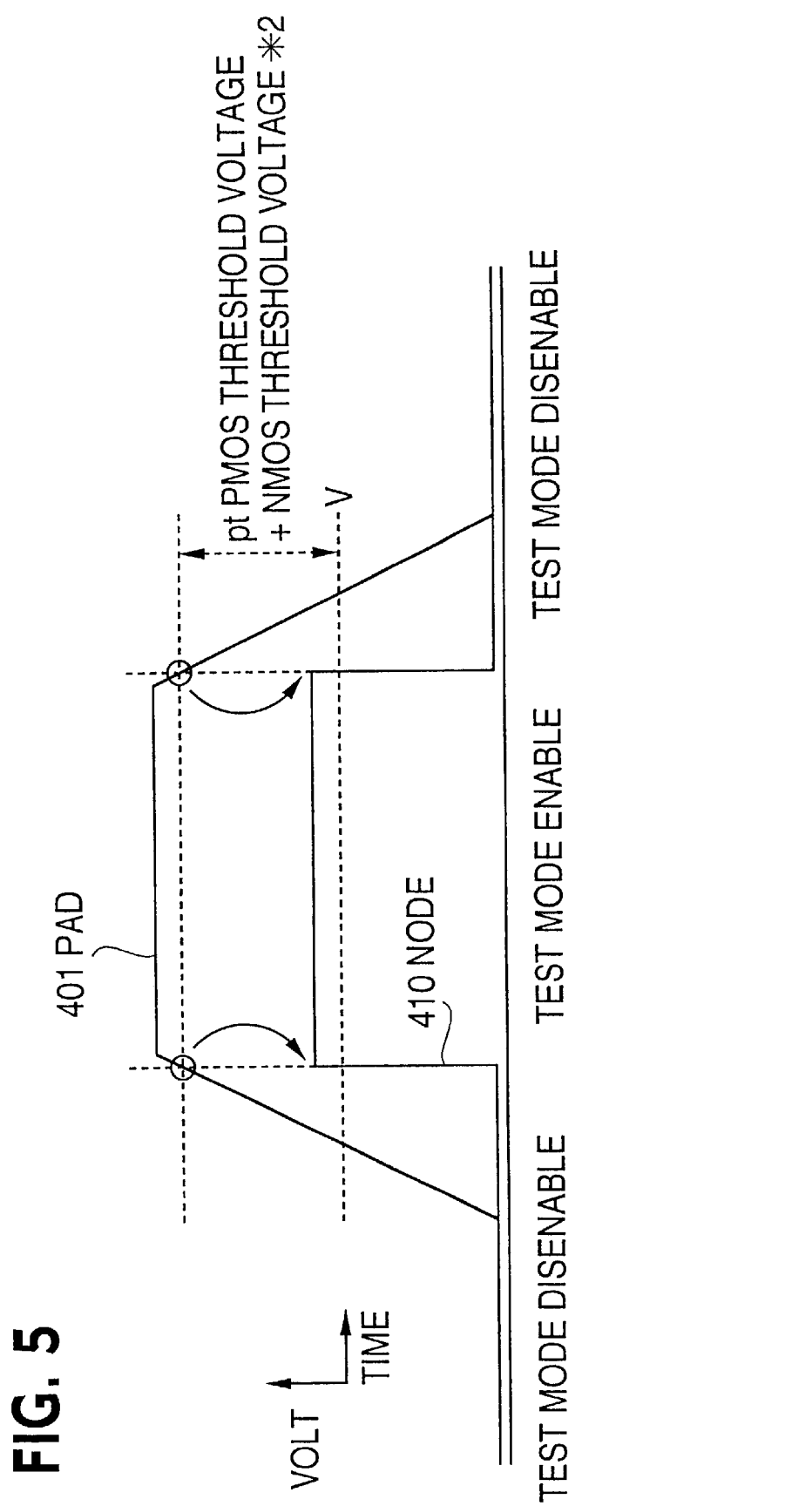
FIG. 5 illustrates voltage levels of the output node of the voltage detecting circuit and the test mode signal input pad.

When the test mode operation is performed, high voltage (about 7~8V) is applied to the test mode signal input pad 401. When the high voltage is applied to the test mode signal input pad 401, NMOS 402, 403 and PMOS 404 becomes on state. That is to say, if the voltage applied to the test mode signal input pad 401 becomes higher than standard voltage VRNS+threshold voltage Vtp of PMOS 404+threshold voltage Vtn of NMOS 402+threshold voltage Vtn of NMOS 403 (VRNS+Vtp+Vtn+Vtn), NMOS 402, 403 and PMOS 404 becomes on state, and the node 410 becomes H level. Therefore, the test mode control circuit as shown in FIG. 1 outputs test mode signal. FIG. 5 shows voltage levels of node 410 and the test mode signal input pad 401.

The PMOS 404 is connected to NMOS 402 and 403 in series, and the gate of the PMOS 404 is connected to the standard voltage VRNS in the present embodiment. Therefore, when the voltage, which is applied to the test mode signal input pad 401, becomes higher than (VRNS+Vtp+Vtn+Vtn), the semiconductor memory device starts the test mode operation. The standard voltage VRNS can be used to detect the high voltage in this embodiment. As described above, the voltage value of the VRNS is adjusted to the expected value, and the voltage value of VRNS is not varies according to the temperature, manufacturing error, and so on. Therefore, the influence of the manufacturing error can be reduced. The test mode operation is performed stably.

Figure 6:
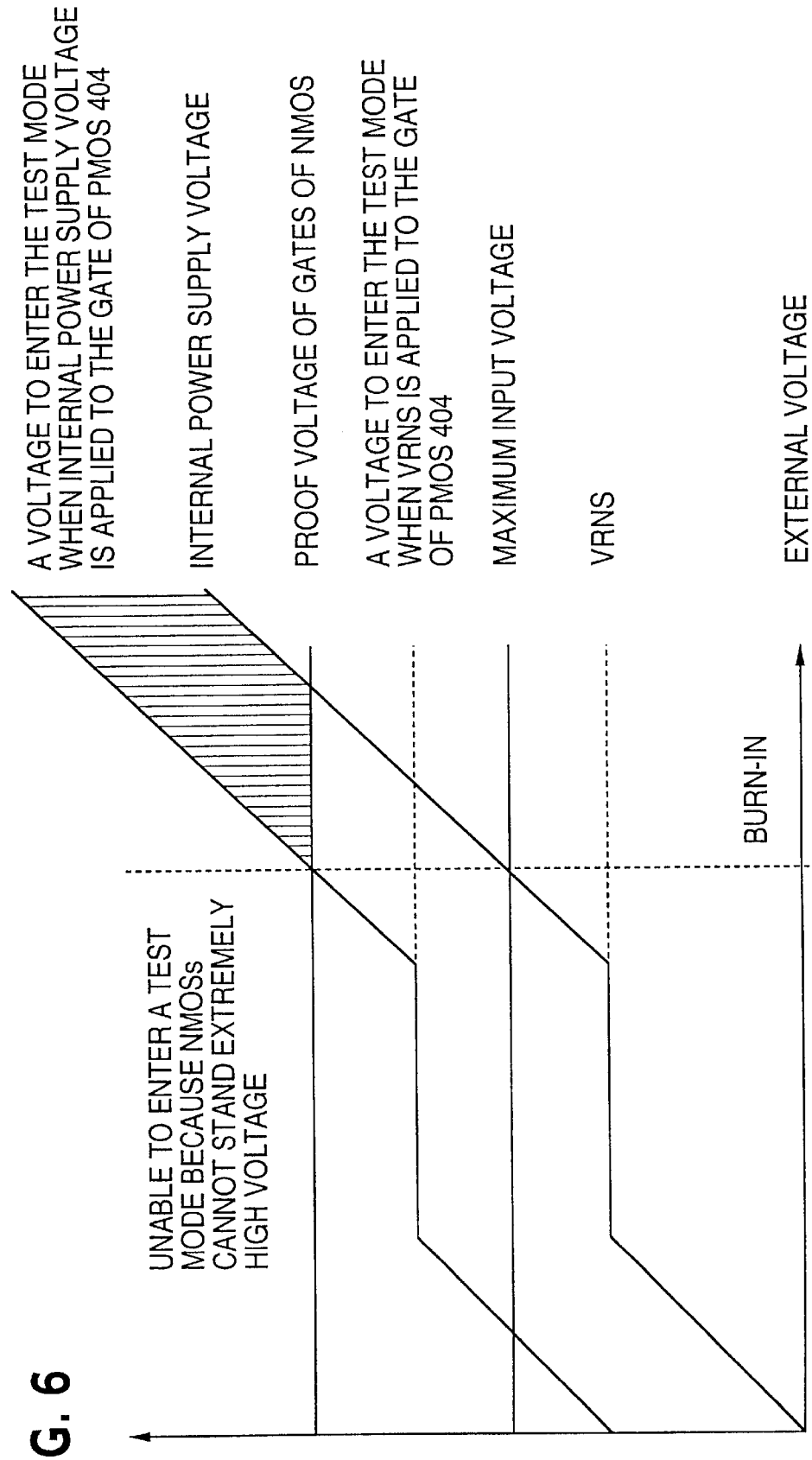
FIG. 6 illustrates the external power supply voltage and the internal supply voltage when a bum-in test is performed.

The standard voltage VRNS is not increased when the burn-in test is performed. When the burn-in test is performed, the external power supply voltage and the internal power supply voltage are increased. FIG. 6 shows the external power supply voltage and the internal power supply voltage when the burn-in test is performed. If the internal power supply voltage is applied to the gate of the PMOS 404, high voltage is applied to the gate of PMOS 404 during the burn-in test. Therefore, extremely high voltage has to be applied to get into the test mode during the burn-in test as shown in FIG. 6. NMOSs 402 and 403 cannot stand the extremely high voltage. Therefore, the standard voltage VRNS is applied to the gate of the PMOS 404.

As described above, the PMOS is used in the voltage detecting circuit in this embodiment. The fixed voltage is applied to the gate of the PMOS 404. Therefore, the influence of manufacturing error is reduced, and the test mode operation is performed stably even if the burn-in test is performed.

Figure 7:
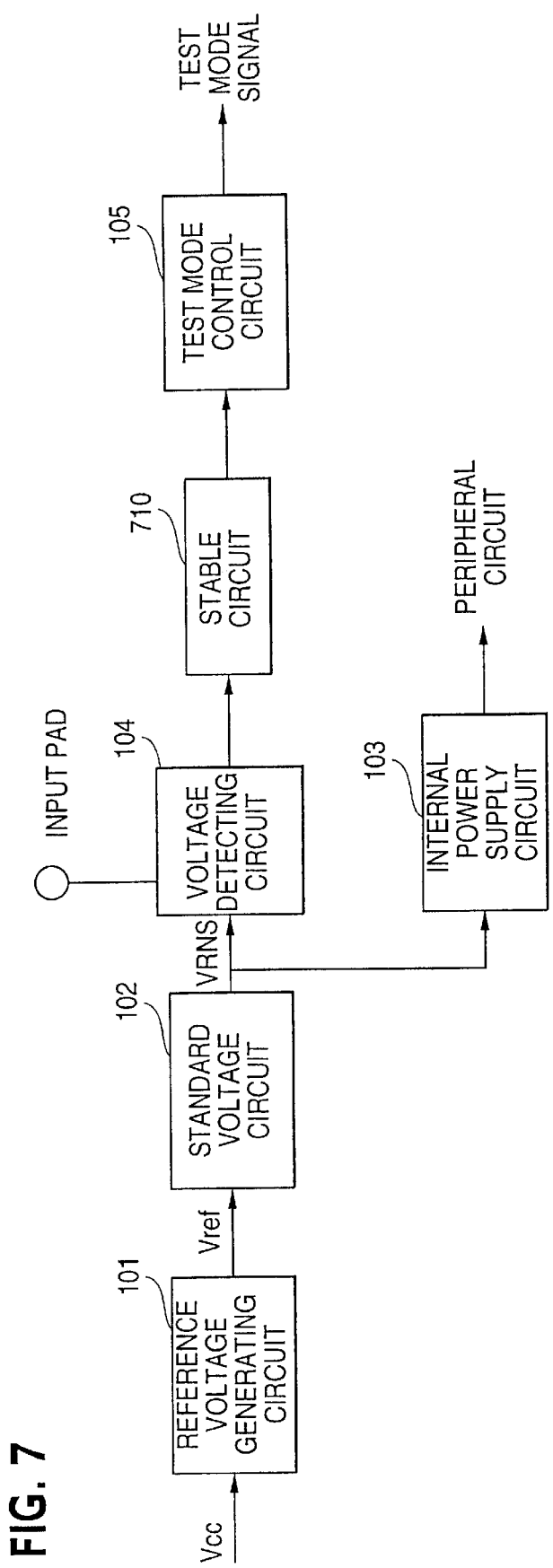
FIG. 7 illustrates a semiconductor memory device of a second embodiment.

FIG. 7 shows a semiconductor memory device of the second preferred embodiment. The basic components are the same as the first preferred embodiment. A stable circuit 710 is inserted between the voltage detecting circuit 104 and the test mode control circuit 105 in the second preferred embodiment.

Noises are sometimes applied to the test mode signal input pad 401. This causes error test mode operation. Therefore, certain period of high voltage has to be applied to the test mode signal input pad 401 in the second preferred embodiment.

Each circuit is the same as the first preferred embodiment except for the stable circuit 710. The components and the operation of the stable circuit 710 are described below.

The input terminal of the stable circuit is connected to the node 410 of the voltage detecting circuit, and the output terminal of the stable circuit is connected to the test mode control circuit.

Figure 8:
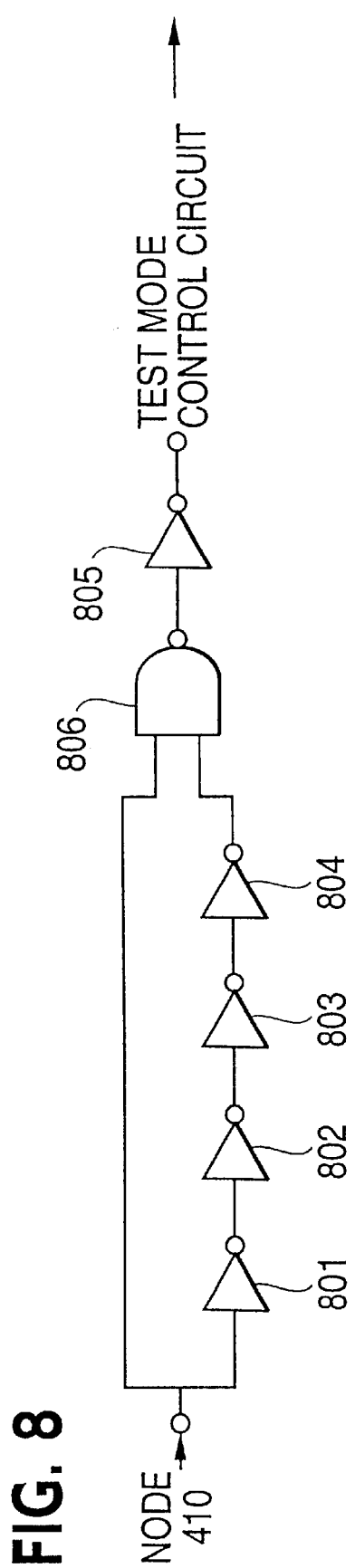
FIG. 8 illustrates a stable circuit of FIG. 7.

FIG. 8 shows the first stable circuit of the second preferred embodiment. The stable circuit has a plurality of inverters 801~805 and a NAND gate 806.

Figure 9A:
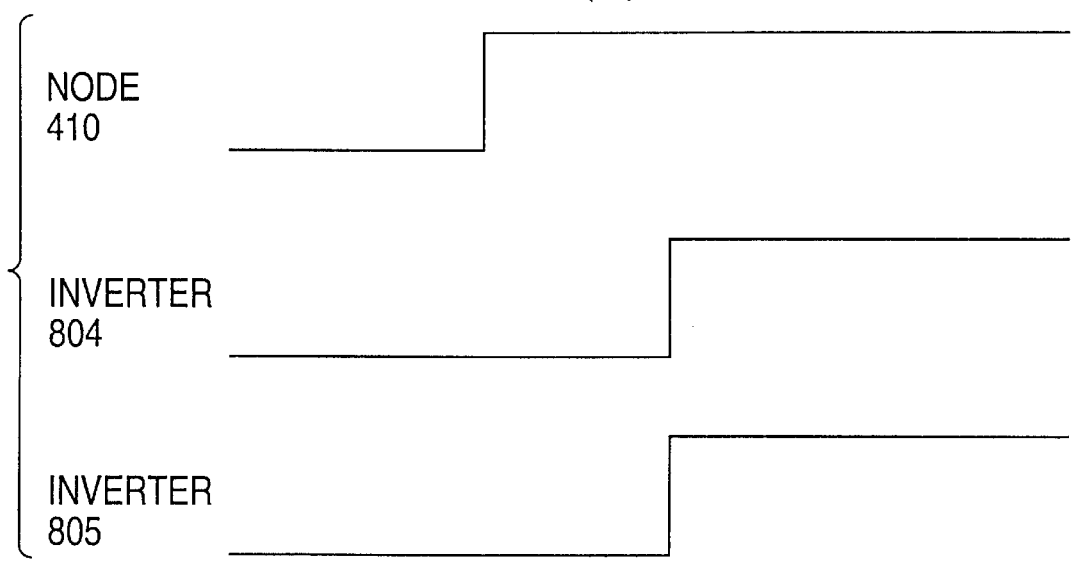
FIGS. 9(a) and 9(b) illustrate operation wave patterns of the stable circuit.
Figure 9B:
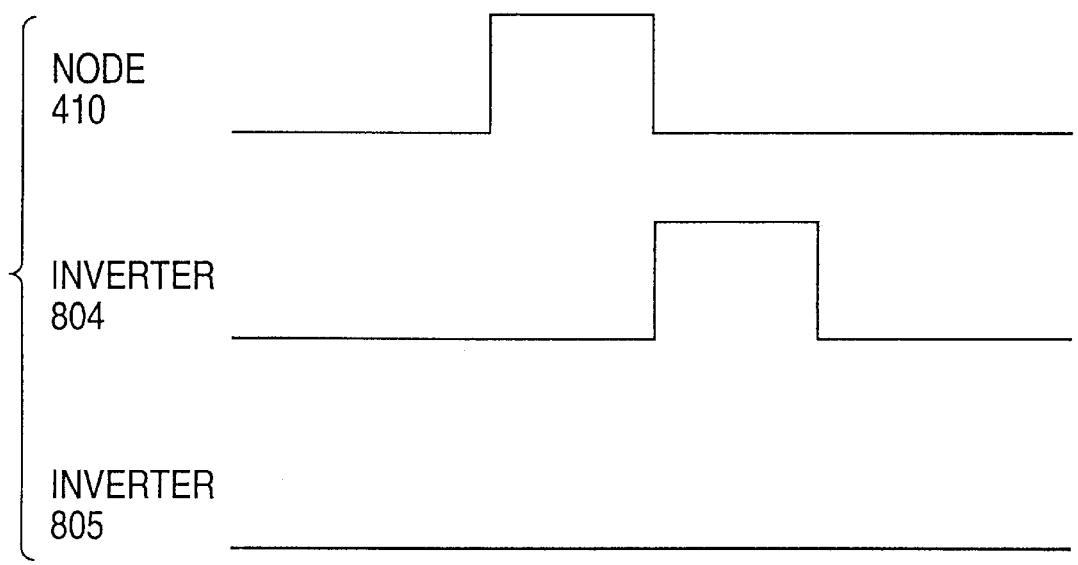

One input terminal of the NAND gate 806 is connected to the node 410 of the voltage detecting circuit. Another input terminal of the NAND gate is connected to the node 410 through even number of inverters 801~804. FIG. 9 shows an operation wave pattern of the stable circuit. The operation of the stable circuit is described below.

When the node 410 of the voltage detecting circuit becomes H level, H level signal is inputted to one input of the NAND gate. Another input terminal of the NAND gate 806 becomes H level with delay because of the inverters. Therefore, the inverter 805 outputs H level signal, when the node 410 keeps H level for certain period. The output signal of the inverter 806 makes the semiconductor memory device get into the test mode operation. (FIG. 9-a)

The H level signal is inputted to one input of the NAND gate, when the node 410 becomes H level by mistake. However, H level signal is inputted to another input of the NAND gate with delay. Therefore, certain period of H level signal is needed to get into the test mode. (FIG. 9-b)

Therefore, test mode operation by mistake is prevented.

Figure 10:
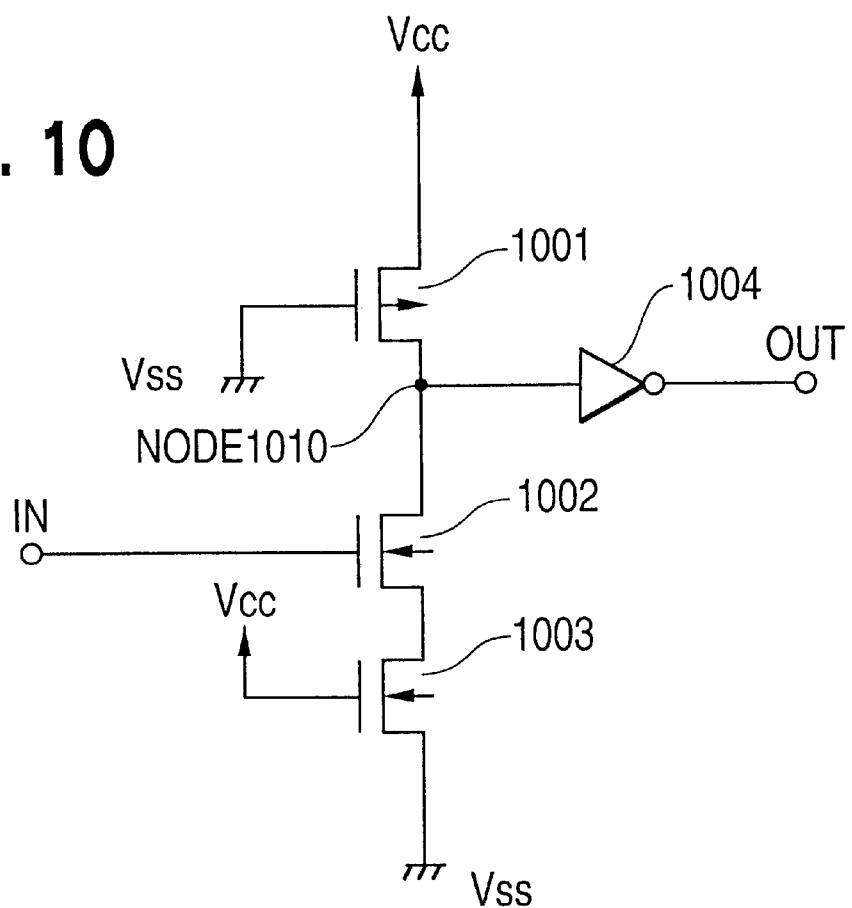
FIG. 10 illustrates a stable circuit of a further embodiment.

FIG. 10 shows another stable circuit of the second preferred embodiment.

The input terminal of the stable circuit is connected to the node 410 of the voltage detecting circuit, and the output terminal of the stable circuit is connected to the test mode control circuit. The stable circuit has PMOS 1001 and NMOSs 1002,1003. The gate of the PMOS 1001 is connected to the ground voltage Vss, the source is connected to the power supply voltage Vcc, and the drain is connected to the input terminal of the inverter 1004. The gate of the NMOS 1002 is connected to the node 410 of the voltage detecting circuit, the source is connected to the drain of the NMOS 1003, and the drain is connected to the input terminal of the inverter 1004. The gate of the NMOS 1003 is connected to the fixed voltage (for example, Vcc, VRNS), the source is connected to the ground voltage Vss, and the drain is connected to the source of the NMOS 1002.

Figure 11:
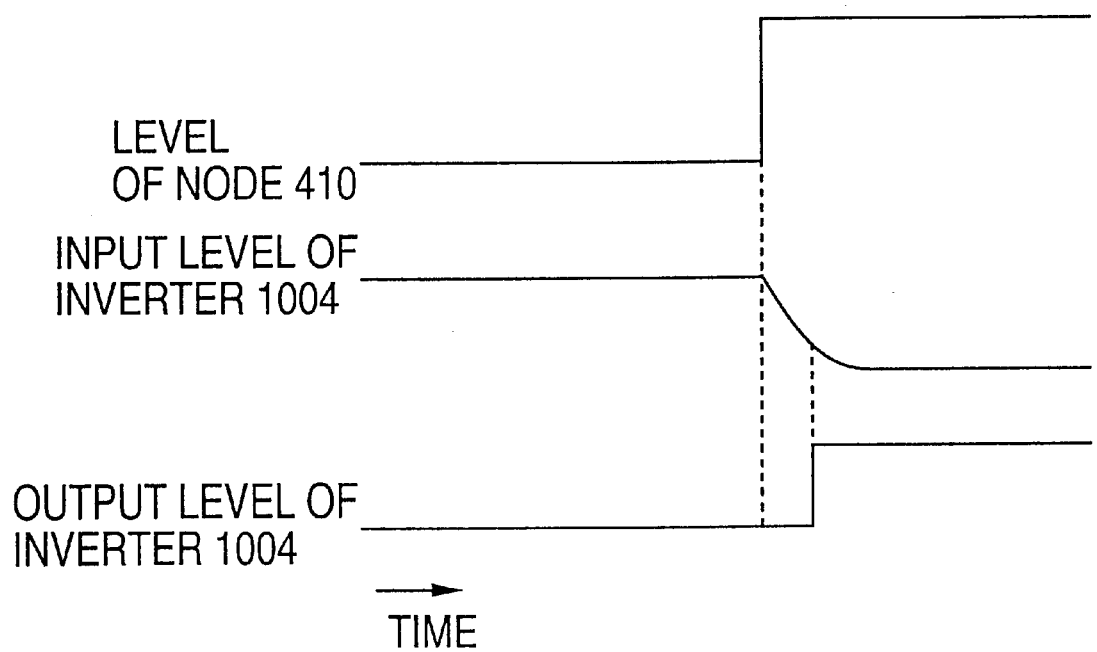
FIG. 11 illustrates operation wave patterns of the stable circuit of FIG. 10.
Figure 12:
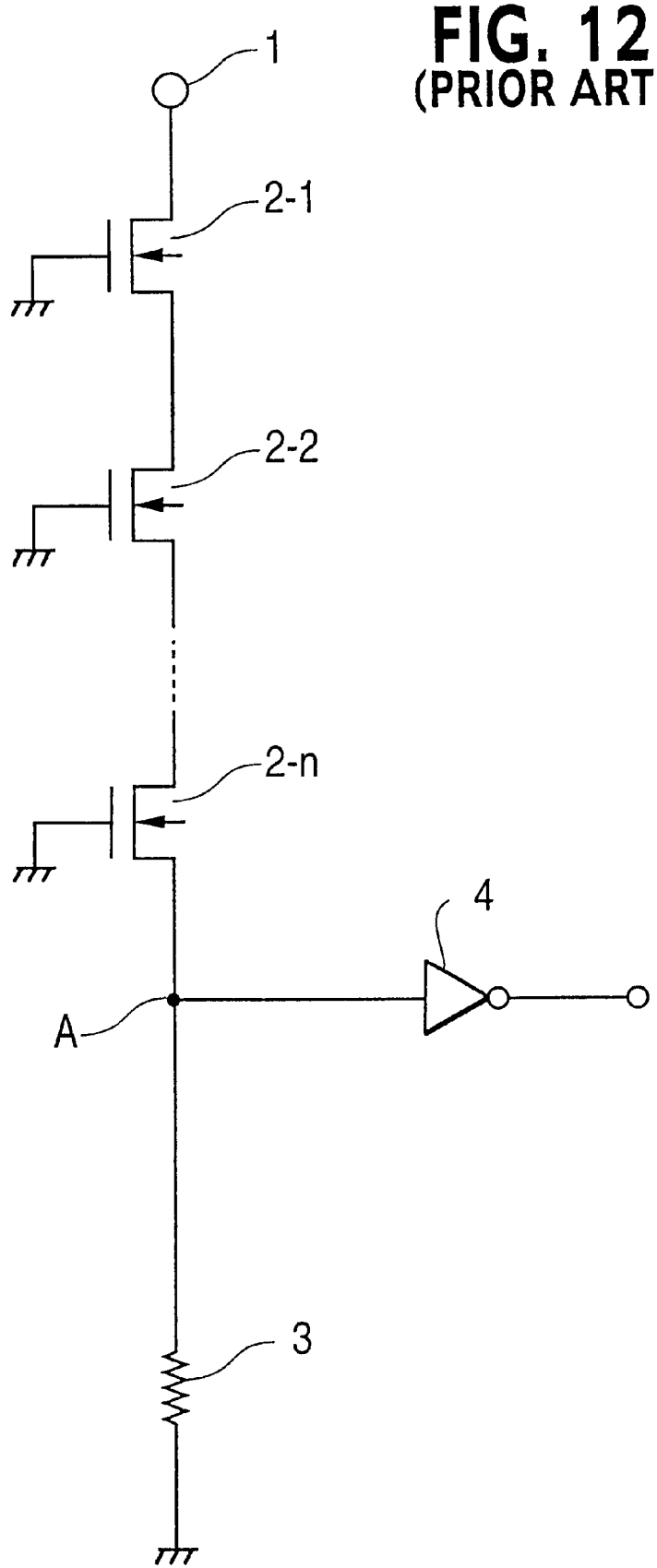
FIG. 12 illustrates a conventional voltage detecting circuit.

FIG. 11 shows an operation wave pattern of the stable circuit. The operation of the stable circuit is described below. L level signal is applied to the gate of NMOS 1002 normally, and the ground voltage is applied to the PMOS 1001. Therefore, the H level signal is applied to the input terminal of the inverter 1004.

When the super high voltage is applied to the test mode signal input pad, H level signal is applied to the gate of the NMOS 1002. Therefore, the voltage level of the input terminal of the inverter 1004 starts decreasing. There are resistance of the NMOS 1003 and the parasitic capacitor of the inverter, therefore there is a time constant for the input terminal of the inverter to become L level. Therefore, certain period of H level signal is needed to get into the test mode. The stable circuit of this embodiment needs less area than the first stable circuit.

As described above, the semiconductor memory device of the preferred embodiments, can detect a high voltage stably, and the influence of the manufacturing error is reduced.

What is claimed is:

1. A semiconductor memory device comprising:
   a reference voltage circuit that has an external power supply voltage input thereto, and that outputs a reference voltage;
   a standard voltage circuit that has the reference voltage input thereto, and that outputs a standard voltage;
   a voltage detecting circuit that detects a test signal to provide a detection signal, the voltage detecting circuit including a PMOS transistor having a gate supplied with the standard voltage, a source coupled to a test signal input pad, and a drain supplied with a ground voltage via a resistive element, the detection signal being output from a node between the PMOS transistor and the resistive element; and a test mode control circuit that outputs a test mode operation signal, an input terminal of the test mode control circuit receiving the detection signal.

2. The semiconductor memory device of claim 1, wherein a voltage level of the standard voltage output by said standard voltage circuit is selectable.

3. The semiconductor memory device of claim 2, wherein said standard voltage circuit comprises:
   a selector circuit that selectively provides a plurality of output signals of first and second voltage levels;
   a decoder circuit, coupled to the selector circuit, that decodes the plurality of output signals to provide a switch signal; and
   an output circuit, coupled to the reference voltage circuit, that converts the reference voltage into the standard voltage having a voltage level based on the switch signal.

4. The semiconductor memory device of claim 3, wherein the selector circuit comprises a plurality of fuses that are selectively blown to provide the plurality of output signals as having either of the first and second voltage levels.

5. The semiconductor memory device of claim 1, further comprising a stability circuit, coupled between the voltage detecting circuit and the test mode control circuit, that receives the detection signal from the voltage detecting circuit and outputs the detection signal to the test mode control circuit only if the detection signal is in an active state for a predetermined time period.

6. The semiconductor memory device of claim 5, wherein the stability circuit comprises:
   a plurality of inverters coupled together in series, a first of the inverters having an input coupled to the detection signal and a last of the inverters providing an inverter signal; and
   a logic circuit that outputs the detection signal to the test mode control circuit based on a logical operation performed on the detection signal and the inverter signal.

7. The semiconductor memory device of claim 6, wherein the logic circuit is a NAND gate.

8. The semiconductor memory device of claim 5, wherein the stability circuit comprises:
   a first NMOS transistor having a gate coupled to the detection signal;
   a second NMOS transistor having a gate coupled to a fixed voltage level, a drain coupled to a source of the first NMOS, and a source coupled to the ground voltage;
   a second PMOS transistor having a gate coupled to the ground voltage, a drain coupled to the drain of the first NMOS transistor and a source coupled to the fixed voltage level; and
   an inverter having an input coupled to the drains of the second PMOS transistor and the first NMOS transistor, that outputs the detection signal to the test mode control circuit.

9. The semiconductor memory device of claim 8, wherein the inverter delays output of the detection signal according to a resistance of the second MOS transistor and a parasitic capacitance of the inverter.

10. A semiconductor memory device comprising:
    a reference voltage circuit that has an external power supply voltage input thereto, and that outputs a reference voltage;
    a standard voltage circuit that has the reference voltage input thereto, and that outputs a standard voltage;
    a transistor that detects a test signal to provide a detection signal, the transistor having a gate that is supplied with the standard voltage, a source that is coupled to a test signal input pad, and a drain that is coupled to a ground voltage via a resistive element, the detection signal being provided from a node between the transistor and the resistive element;
    a stability circuit that outputs a test mode signal when a voltage level of the detection signal is at a high level for a predetermined time period; and
    a test mode control circuit that has the test mode signal input thereto.

11. The semiconductor memory device of claim 10, wherein the transistor is a PMOS transistor.

12. The semiconductor memory device of claim 10, wherein a voltage level of the standard voltage output by said standard voltage circuit is selectable.

13. The semiconductor memory device of claim 12, wherein said standard voltage circuit comprises:
    a selector circuit that selectively provides a plurality of output signals of first and second voltage levels;
    a decoder circuit, coupled to the selector circuit, that decodes the plurality of output signals to provide a switch signal; and
    an output circuit, coupled to the reference voltage circuit, that converts the reference voltage into the standard voltage having a voltage level based on the switch signal.

14. The semiconductor memory device of claim 13, wherein the selector circuit comprises a plurality of fuses that are selectively blown to provide the plurality of output signals as having either of the first and second voltage levels.

15. The semiconductor memory device of claim 10, wherein the stability circuit comprises:
    a plurality of inverters coupled together in series, a first of the inverters having an input coupled to the detection signal and a last of the inverters providing an inverter signal; and
    a logic circuit that outputs the test mode signal based on a logical operation performed on the detection signal and the inverter signal.

16. The semiconductor memory device of claim 15, wherein the logic circuit is a NAND gate.

17. The semiconductor memory device of claim 10, wherein the stability circuit comprises:
    a first NMOS transistor having a gate coupled to the detection signal;
    a second NMOS transistor having a gate coupled to a fixed voltage level, a drain coupled to a source of the first NMOS, and a source coupled to the ground voltage;
    a PMOS transistor having a gate coupled to the ground voltage, a drain coupled to the drain of the first NMOS transistor and a source coupled to the fixed voltage level; and
    an inverter having an input coupled to the drains of the PMOS transistor and the first NMOS transistor, that outputs the test mode signal.

18. The semiconductor memory device of claim 17, wherein the inverter delays output of the detection signal according to a resistance of the second MOS transistor and a parasitic capacitance of the inverter.

* * * * *